United States Patent
Kusumoto et al.

(10) Patent No.: US 7,517,774 B2
(45) Date of Patent: **\*Apr. 14, 2009**

(54) LASER ANNEALING METHOD

(75) Inventors: Naoto Kusumoto, Kanagawa-ken (JP); Koichiro Tanaka, Kanagawa-ken (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/735,542

(22) Filed: Apr. 16, 2007

(65) Prior Publication Data
US 2007/0190710 A1 Aug. 16, 2007

Related U.S. Application Data

(63) Continuation of application No. 11/203,282, filed on Aug. 15, 2005, now Pat. No. 7,208,358, which is a continuation of application No. 10/602,762, filed on Jun. 25, 2003, now Pat. No. 6,947,452, which is a continuation of application No. 08/594,670, filed on Feb. 2, 1996, now Pat. No. 6,596,613.

(30) Foreign Application Priority Data

Feb. 2, 1995 (JP) .................. 07-037705
Mar. 2, 1995 (JP) .................. 07-068670

(51) Int. Cl.
*H01L 21/20* (2006.01)
(52) U.S. Cl. .................................. 438/487
(58) Field of Classification Search .......... 438/487
See application file for complete search history.

(56) References Cited

U.S. PATENT DOCUMENTS

| 3,585,088 A | 6/1971 | Schwuttke et al. |
| 4,195,913 A | 4/1980 | Dourte et al. |
| 4,475,027 A | 10/1984 | Pressley |
| 5,145,808 A | 9/1992 | Sameshima et al. |
| 5,219,786 A | 6/1993 | Noguchi |

(Continued)

FOREIGN PATENT DOCUMENTS

EP 0612102 8/1994

(Continued)

OTHER PUBLICATIONS

Anderson.G et al., "Characterization of the Substrate Interface of Excimer Laser Crystallized Polycrystalline Silicon Thin Films,", Mat. Res. Soc. Symp. Proc. (Materials Research Society Symposia Proceedings), Apr. 4, 1994, vol. 343, pp. 709-714.

(Continued)

*Primary Examiner*—Evan Pert
(74) *Attorney, Agent, or Firm*—Fish & Richardson P.C.

(57) ABSTRACT

In crystallizing an amorphous silicon film by illuminating it with linear pulse laser beams having a normal-distribution type beam profile or a similar beam profile, the linear pulse laser beams are applied in an overlapped manner. There can be obtained effects similar to those as obtained by a method in which the laser illumination power is gradually increased and then decreased in a step-like manner in plural scans.

23 Claims, 4 Drawing Sheets

U.S. PATENT DOCUMENTS

| | | | |
|---|---|---|---|
| 5,304,357 A | 4/1994 | Sato et al. | |
| 5,352,291 A | 10/1994 | Zhang et al. | |
| 5,365,875 A | 11/1994 | Asai et al. | |
| 5,424,244 A | 6/1995 | Zhang et al. | |
| 5,432,122 A | 7/1995 | Chae | |
| 5,477,073 A | 12/1995 | Wakai et al. | |
| 5,496,768 A | 3/1996 | Kudo | |
| 5,561,081 A | 10/1996 | Takenouchi et al. | |
| 5,569,610 A | 10/1996 | Zhang et al. | |
| 5,578,520 A | 11/1996 | Zhang et al. | |
| 5,591,668 A | 1/1997 | Maegawa et al. | |
| 5,608,232 A | 3/1997 | Yamazaki et al. | |
| 5,614,733 A | 3/1997 | Zhang et al. | |
| 5,639,698 A | 6/1997 | Yamazaki et al. | |
| 5,643,801 A | 7/1997 | Ishihara et al. | |
| 5,766,344 A | 6/1998 | Zhang et al. | |
| 5,783,468 A | 7/1998 | Zhang et al. | |
| 5,795,795 A | 8/1998 | Kousai et al. | |
| 5,843,225 A | 12/1998 | Takayama et al. | |
| 5,849,043 A | 12/1998 | Zhang et al. | |
| 5,861,337 A | 1/1999 | Zhang et al. | |
| 5,891,764 A | 4/1999 | Ishihara et al. | |
| 5,897,347 A | 4/1999 | Yamazaki et al. | |
| 5,897,799 A | 4/1999 | Yamazaki et al. | |
| 5,956,579 A | 9/1999 | Yamazaki et al. | |
| 6,084,247 A | 7/2000 | Yamazaki et al. | |
| 6,143,661 A | 11/2000 | Kousai et al. | |
| 6,174,374 B1 | 1/2001 | Zhang et al. | |
| 6,242,292 B1 | 6/2001 | Yamazaki et al. | |
| 6,358,784 B1 | 3/2002 | Zhang et al. | |
| 6,494,162 B1 | 12/2002 | Zhang et al. | |
| 6,576,534 B1 | 6/2003 | Zhang et al. | |
| 6,596,613 B1 * | 7/2003 | Kusumoto et al. | 438/487 |
| 6,610,142 B1 | 8/2003 | Takayama et al. | |
| 6,770,143 B2 | 8/2004 | Zhang et al. | |
| 6,947,452 B2 * | 9/2005 | Kusumoto et al. | 372/9 |
| 6,997,985 B1 | 2/2006 | Yamazaki et al. | |
| 7,208,358 B2 * | 4/2007 | Kusumoto et al. | 438/166 |
| 2003/0015133 A1 | 1/2003 | Zhang et al. | |
| 2003/0207524 A1 | 11/2003 | Zhang et al. | |
| 2006/0030166 A1 | 2/2006 | Kusumoto et al. | |

FOREIGN PATENT DOCUMENTS

| | | |
|---|---|---|
| EP | 1119053 | 7/2001 |
| JP | 64-076715 | 3/1989 |
| JP | 01-260811 | 10/1989 |
| JP | 02-224346 | 9/1990 |
| JP | 03-286518 | 12/1991 |
| JP | 04-124813 | 4/1992 |
| JP | 04-307727 | 10/1992 |
| JP | 05-182923 | 7/1993 |
| JP | 05-198507 | 8/1993 |
| JP | 06-232059 | 8/1994 |
| JP | 06-244103 | 9/1994 |
| JP | 06-296020 | 10/1994 |
| JP | 06-318701 | 11/1994 |
| JP | 08-051074 | 2/1996 |
| JP | 08-213341 | 8/1996 |
| ZA | 8306334 | 3/1984 |

OTHER PUBLICATIONS

Brotherton.S et al., "Beam Shape Effects With Excimer Laser Crystallisation of Plasma Enhanced and Low Pressure Chemical Vapor Deposited Amorphous Silicon,", Solid State Phenomena, 1994, vol. 37-38, pp. 299-304.

Carluccio.R et al., "Microstructure of Polycrystalline Silicon Films Obtained by Combined Furnace and Laser Annealing,", Appl. Phys. Lett. (Applied Physics Letters), Mar. 13, 1995, vol. 66, No. 11, pp. 1394-1396.

Caune.S et al., "Combined CW Laser and Furnace Annealing of Amorphous SI and GE in Contact With Some Metals,", Applied Surface Science, 1989, vol. 36, pp. 597-604.

Hayashi.H et al., "Fabrication of Low-Temperature Bottom-Gate Poly-Si TFTS on Large-Area Substrate by Linear-Beam Excimer Laser Crystallization and Ion Doping Method,", IEDM 95: Technical Digest of International Electron Devices Meeting, 1995, pp. 33.3.1-33.3.4(829-832).

Jhon.Y et al., "Crystallization of Amorphous Silicon by Excimer Laser Annealing With a Line Shape Beam Having a Gaussian Profile,", Jpn. J. Appl. Phys. (Japanese Journal of Applied Physics), Oct. 15, 1994, vol. 33/Part 2, No. 10B, pp. L1438-L1441.

Kuriyama.H et al., "Lateral Grain Growth of Poly-Si Films With a Specific Orientation by an Excimer Laser Annealing Method,", Jpn. J. Appl. Phys. (Japanese Journal of Applied Physics, Dec. 1, 1993, vol. 32, No. 12B, pp. 6190-6195.

Kuriyama.H et al., "Improving the Uniformity of Poly-Si Films Using a New Excimer Laser Annealing Method for Giant-Microelectronics,", Jpn. J. Appl. Phys. (Japanese Journal of Applied Physics), Dec. 1, 1992, vol. 31, No. 12B, pp. 4550-4554.

Kohno.A et al., "High Performance Poly-Si TFTS Fabricated Using Pulsed Laser Annealing and Remote Plasma CVD With Low Temperature Prcessing,", IEEE Transactions on Electron Devices, Feb. 1, 1995, vol. 42, No. 2, pp. 251-257.

Okumura.F et al., "Excimer Laser Annealed Poly-Si TFT Technologies,", Mat. Res. Soc. Symp. Proc. (Materials Research Society Symposia Proceedings), Apr. 18, 1995, vol. 377, pp. 877-889.

Sweatt.W, "Transforming a Circular Laser Beam Into a Source or Trapezoid-Almost,", Optical Engineering, Feb. 1, 1992, vol. 31, No. 2, pp. 245-250.

* cited by examiner

LASER ANNEALING METHOD

CROSS-REFERENCE TO RELATED APPLICATIONS

This application is a continuation application of U.S. application Ser. No. 10/602,762, filed Jun. 25, 2003, now allowed, which is a continuation of U.S. application Ser. No. 08/594,670, filed Feb. 2, 1996, now U.S. Pat. No. 6,596,613, and claims the benefit of foreign priority applications filed in Japan as Serial No. 07-037705 on Feb. 2, 1995 and as Serial No. 07-068670 on Mar. 2, 1995. This application claims priority to each of these prior applications, and the disclosures of the prior applications are considered part of (and are incorporated by reference in) the disclosure of this application.

BACKGROUND OF THE INVENTION

1. Field of the Invention

The present invention relates to a technique of annealing, for instance, a semiconductor material uniformly and efficiently over a large area. The invention also relates to a technique of preventing reduction of processing efficiency in illuminating a particular region while gradually changing the illumination energy density.

2. Description of the Related Art

In recent years, extensive studies have been made of the temperature reduction of semiconductor device manufacturing processes. This is largely due to the need of forming semiconductor devices on an insulative substrate, such as a glass substrate, which is inexpensive and superior in workability. Other needs such as needs of forming finer devices and multilayered devices have also prompted the studies on the process temperature reduction.

In particular, a technique of forming semiconductor devices on a glass substrate is necessary to produce a panel that constitutes an active matrix liquid crystal display device. This is a configuration in which thin-film transistors are formed on a glass substrate so as to assume a matrix of more than several hundred by several hundred. When a glass is exposed to an atmosphere of more than about 600° C., deformation such as contraction and strain becomes remarkable. Therefore, the heating temperature in a thin-film transistor manufacturing process should be as low as possible.

To obtain thin-film transistors having superior electrical characteristics, a crystalline thin-film semiconductor needs to be used.

Among methods of producing a crystalline silicon film is a technique of crystallizing, by a heat treatment, an amorphous silicon film that has been deposited by plasma CVD or low-pressure thermal CVD of about 500° C. This heat treatment is such that a sample is left in an atmosphere of 600° C. or more for more than several hours. In this heat treatment, where the temperature is, for instance, 600° C., long process time of more than 10 hours is needed. In general, if a glass substrate is heated at 600° C. for more than 10 hours, deformation (strain and contraction) of the substrate becomes remarkable. Since a thin-film semiconductor for constituting thin-film transistors is several hundred angstrom in thickness and several micrometers to several tens of micrometers in size, the substrate deformation will cause an operation failure, a variation in electrical characteristics, or the like. In particular, in the case of a large-sized substrate (diagonal size: 20 inches or more), the substrate deformation is a serious problem.

If the heat treatment temperature is higher than 1,000° C., crystallization can be attained in a process time of several hours. However, ordinary glass substrates cannot withstand a high temperature of about 1,000° C. even if a heat treatment lasts for a short time.

Quartz substrates can withstand a heat treatment of more than 1,000° C., and allow production of a silicon film having superior crystallinity. However, large-area quartz substrates are particularly expensive. Therefore, from the economical point of view, they cannot be easily applied to liquid crystal display devices, which will be required to be increased in size in the future.

In the above circumstances, the temperature of processes for manufacturing thin-film transistors is now required to be lowered. Among techniques for attaining this purpose is an annealing technique that uses laser light illumination, which technique now attracts much attention with a possibility of providing an ultimate low-temperature process. Since laser light can impart as high energy as thermal annealing to only a necessary portion, it is not necessary to expose the entire substrate to a high-temperature atmosphere. Therefore, the annealing technique by laser light illumination enables use of glass substrates.

However, the annealing technique by laser light illumination has a problem of unstable laser light illumination energy. Although this problem can be solved by using a laser apparatus capable of emitting laser light of higher energy than necessary one and attenuating the output laser light, there remains another problem of cost increase due to increased size of the laser apparatus.

Even with such a problem, the annealing technique by laser light illumination is still very advantageous in that it enables use of glass substrates.

In general, there are two laser light illumination methods described below.

In a first method, a CW laser such as an argon ion laser is used and a spot-like beam is applied to a semiconductor material. A semiconductor material is crystallized such that it is melted and then solidified gradually due to a sloped energy profile of a beam and its movement.

In a second method, a pulsed oscillation laser such as an excimer laser is used. A semiconductor material is crystallized such that it is instantaneously melted by application of a high-energy laser pulse and then solidified.

The first method of using a CW laser has a problem of long processing time, because the maximum energy of the CW laser is insufficient and therefore the beam spot size is at most several millimeters by several millimeters. In contrast, the second method using a pulsed oscillation laser can provide high mass-productivity, because the maximum energy of the laser is very high and therefore the beam spot size can be made several square centimeters or larger.

However, in the second method, to process a single, large-area substrate with an ordinary square or rectangular beam, the beam needs to be moved in the four orthogonal directions, which inconvenience still remains to be solved from the viewpoint of mass-productivity.

This aspect can be greatly improved by deforming a laser beam into a linear shape that is longer than the width of a subject substrate, and scanning the substrate with such a deformed beam.

The remaining problem is insufficient uniformity of laser light illumination effects. The following measures are taken to improve the uniformity. A first measure is to make the beam profile as close to a rectangular one as possible by causing a laser beam to pass through a slit, to thereby reduce an intensity variation within a linear beam. A second measure to further improve the uniformity is to perform preliminary illumination with pulse laser light that is weaker than that of subsequently performed main illumination. This measure is so effective that the characteristics of resulting semiconductor devices can be improved very much.

The reason why the above two-step illumination is effective is that a semiconductor material film including many amorphous portions has a laser energy absorption ratio that is much different than a polycrystalline film. For example, a common amorphous silicon film (a-Si film) contains hydrogen at 20 to 30 atomic percent. If laser light having high energy is abruptly applied to an amorphous silicon film, hydrogen is ejected therefrom, so that the surface of the film is roughened, i.e., formed with asperities of several tens of angstrom to several hundred angstrom. Since a thin-film semiconductor for a thin-film transistor is several hundred angstrom in thickness, its surface having asperities of several tens of angstrom to several hundred angstrom will be a major cause of variations in electrical characteristics etc.

Where the two-step illumination is performed, a process proceeds such that a certain part of hydrogen is removed from an amorphous silicon film by the weak preliminary illumination and crystallization is effected by the main illumination. Since the illumination energy is not high in the preliminary illumination, there does not occur severe surface roughening of the film due to sudden hydrogen ejection.

The uniformity of the laser light illumination effects can be improved considerably. However, if the above two-step illumination is employed, the laser processing time is doubled, thus reducing throughput. Further, since a pulsed laser is used, some variation occurs in the laser annealing effects depending on the registration accuracy of the main illumination and preliminary illumination, which variation may greatly influence the characteristics of thin-film transistors having a size of several tens of micrometers by several tens of micrometers.

In general, among various processing techniques (for example, causing a quality change in various materials and processing by application of laser energy) by laser light illumination is a technique in which a certain region is illuminated plural times with laser beams of varied energies. The above-described annealing technique for a silicon film is an example of such a technique.

Conventionally, in such a technique, a laser beam is applied plural times, which however elongates the processing time by a factor of the number of illumination times, and causes a large decrease in the operation efficiency. Further, illuminating a particular region plural times with laser beams likely causes a problem of a deviation of illumination areas, and is not practical because solving this problem may be technically difficult or may require a costly technique.

SUMMARY OF THE INVENTION

An object of the present invention is to solve the problem of nonuniformity of the effects of annealing by laser light illumination. Another object of the invention is to improve the economy of laser light illumination.

The invention solves the above problems by devising a new energy profile of a linear laser beam, which profile varies continuously or step-like manner. Specifically, a normal-distribution type profile or a trapezoidal profile is employed.

To solve the above problems, one aspect of the invention is characterized in that an illumination object is illuminated with pulse laser beams that have been shaped into linear beams while being scanned with the laser beams relatively in one direction.

For example, as shown in FIG. 3, a semiconductor material is illuminated, while being scanned, with a laser beam having a normal-distribution type energy profile in its width direction (i.e., scanning direction). With this illumination method, a foot-to-middle portion of the normal-distribution type profile corresponds to the preliminary illumination having low laser beam energy, while a middle-to-top portion of the profile corresponds to the main illumination having high energy. Therefore, a single laser beam illuminating operation can provide effects similar to those obtained by the two-step or multi-step laser beam illumination. Alternatively, as shown in FIG. 5, a semiconductor material is illuminated with a laser beam having a trapezoidal energy profile in its width direction (scanning direction). In this case, a slope portion of the trapezoidal profile has a function of imparting energy corresponding to that of the preliminary illumination, while a top base portion of the profile has a function of imparting energy corresponds to that of the main illumination.

Another aspect of the invention is characterized in that an illumination object is illuminated with pulse laser beams that have been shaped into linear beams while the laser beams are moved in one direction, in which the laser beams are applied in an overlapped manner so that an arbitrarily selected point on the illumination object is illuminated plural times.

In this method, a particular region is illuminated with laser beams plural times by applying linear laser beams in an overlapped manner.

In particular, where laser beams having a normal-distribution type energy profile (see FIG. 3) or a trapezoidal energy profile (see FIG. 5) in the scanning direction are applied in an overlapped manner while being moved little by little, in a particular linear region the applied energy density first increases continuously or in a step-like manner and then decreases continuously or in a step-like manner. Therefore, this method can provide effects similar to those obtained by the two-step or multi-step laser light illumination.

To provide effects equivalent to those obtained by the multi-step illumination, the number of overlapping of laser beam pulses may be set at 3 to 100, preferably 10 to 30.

However, to obtain necessary annealing effects, it is preferred that the laser beam illumination is so performed as to satisfy certain conditions, which are:

(1) The illumination object is a silicon film of 150 to 1,000 Å in thickness.

(2) The laser beams are pulse beams having a pulse rate of N per second, assumes a linear shape having a width L, and has a beam profile in which the energy density varies continuously or in a step-like manner in the width direction.

(3) The laser beams are applied to an illumination surface while being moved at a speed V in the width direction.

(4) The average single-pulse energy density is set at 100 to 500 $mJ/cm^2$.

(5) The laser beams are applied so as to satisfy a relationship $10 \leq LN/V \leq 30$.

A laser beam illumination method of the invention which satisfies the above conditions is described as comprising the steps of:

emitting pulse laser beams at a rate of N times per second;

shaping the pulse laser beams into linear beams having a width L, an energy profile that varies continuously or in a step-like manner in a width direction thereof, and an average single-pulse energy density of 100 to 500 $mJ/cm^2$; and applying the laser beams to a silicon film having a thickness of 150 to 1,000 Å while scanning it with the laser beams in the width direction at a speed V so as to satisfy a relationship $10 \leq LN/V \leq 30$.

Among the above conditions, the condition that the illumination object is a silicon film of 150 to 1,000 Å in thickness is established for the following reasons. Experiments have shown that in annealing of a silicon film, if the thickness of the silicon film is less than 150 Å, the uniformity of film formation, the uniformity of annealing effects, and the reproducibility are insufficient. On the other hand, a silicon film having a thickness of more than 1,000 Å is not practical because it requires a large-output laser. In addition, a crystalline silicon film having such a thickness is not used for a thin-film transistor.

Examples of the laser beam having a beam profile that varies continuously or in a step-like manner in the width direction are a laser beam having a normal-distribution type energy profile in the scanning direction (see FIG. 3) and a laser beam having a trapezoidal energy profile in the scanning direction (see FIG. 5).

The reason for employing the energy density of 100 to 500 mJ/cm$^2$ is that experiments have revealed that laser annealing of a silicon film having a thickness of not more than 1,000 Å can be performed effectively by using a laser beam of the above energy density. The energy density as used above is defined as the value of a top portion of a profile that varies continuously or in a step-like manner. For example, in the case of a normal-distribution type profile, the energy density is defined as the maximum value. In the case of a trapezoidal profile, the energy density is defined as the value of a top base portion.

In the above method, the parameter LN/V represents the number of laser beam pulses applied to a particular linear region when it is scanned with linear pulse laser beams once. To attain the effects as obtained by the multi-step illumination, it is preferred that the number of laser beam pulses be set at 10 to 30.

According to a further aspect of the invention, there is provided a laser beam illumination method comprising the steps of:

emitting pulse laser beams at a rate of N times per second;

shaping the pulse laser beams so that they have an energy profile in which an energy density varies continuously or in a step-like manner over a length L in a predetermined direction; and applying the laser beams to a predetermined region while scanning it with the laser beams in the predetermined direction at a speed V, wherein the number n of laser beam pulses applied to the predetermined region in one scan satisfies a relationship n=LN/V.

By employing the above method, a particular region can be illuminated n times with laser beams whose energy density gradually varies.

In the invention, the laser beam illumination energy profile is not limited to normal-distribution type and trapezoidal profiles. For example, there may be employed a beam shape in which the energy density varies in a step-like manner, or a triangular energy profile may be used.

For example, when a linear laser beam having a normal-distribution type energy profile as shown in FIG. 3 is applied while being moved for scanning in its width direction so that certain conditions are satisfied, first a weak foot portion of the energy profile is applied and the illumination energy gradually increases. After a portion having a certain energy value is applied, the illumination energy gradually decreases and the illumination is finished.

For example, when linear pulse laser beams having a normal-distribution type illumination energy profile in the width direction are used and a condition LN/V=15 is satisfied where L is a beam width, N is the number of emissions per second, and V is a scanning speed, a linear region is illuminated with 15 laser beam pulses in one laser beam scan.

The 15 laser beam pulses, which are sequentially applied, have energy density values of 15 sections of the normal-distribution type profile, respectively. For example, a particular linear region (the width of this region is very narrow) is sequentially illuminated with laser beam pulses having energy density values $E_1$ to $E_{15}$ shown in FIG. 4. As the laser beam pulses of $E_1$ to $E_8$ are sequentially applied, the illumination energy density gradually increases. On the other hand, as the laser beam pulses of $E_8$ to $E_{15}$ are sequentially applied, the illumination energy density gradually decreases.

A process of this type in which first the illumination energy is gradually increased and then gradually decreased can attain desired annealing effects while suppressing surface roughening of a silicon film. Further, since desired effects can be obtained by laser beam illumination of one scan rather than plural times of laser beam illuminating operations, high operation efficiency can be attained.

In particular, effects similar to those as obtained by the multi-step illumination can be attained by using laser beams whose energy density is varied continuously. This function similarly applies to effects other than the annealing effects on a silicon film.

DETAILED DESCRIPTION OF THE PREFERRED EMBODIMENTS

Embodiment 1

In this embodiment, a silicon film is used as a semiconductor material. There is a tendency that in the process of enhancing the crystallinity of an amorphous or crystalline silicon or silicon compound film by illuminating it with a laser beam, the uniformity of the film surface is degraded. The embodiment described below can suppress such degradation in uniformity, reduce the processing time of laser beam illumination from the case of the two-step illumination that was described in the above background part of this specification, and attain effects equivalent or superior to those of the two-step illumination.

Figure 1:
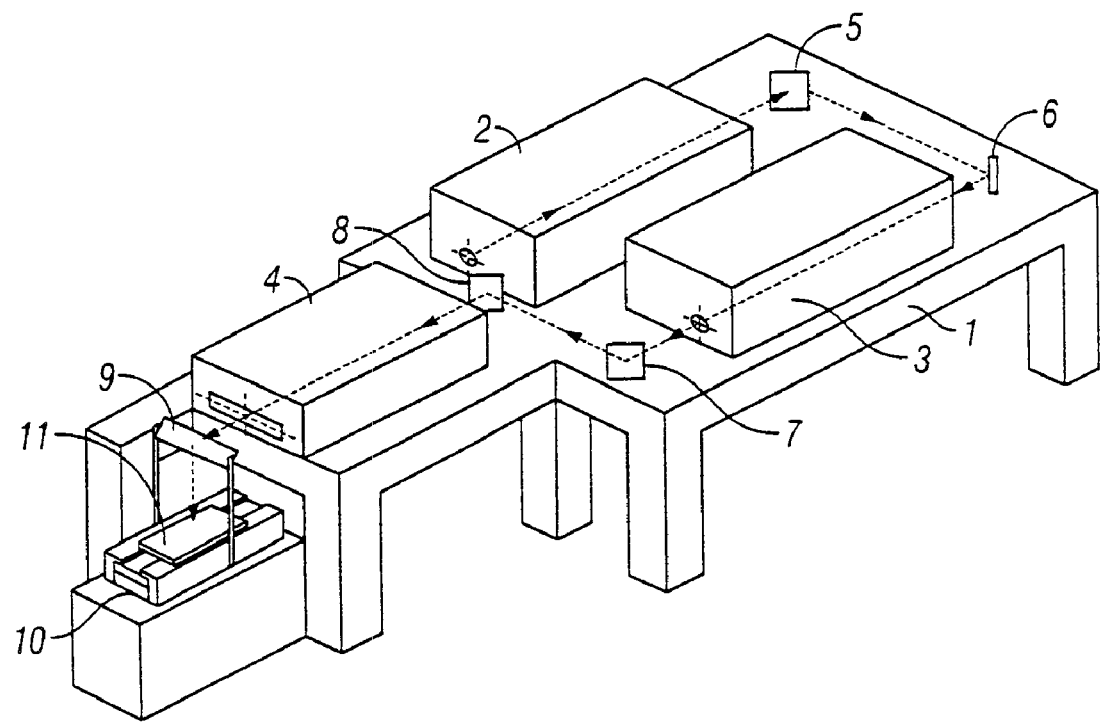
FIG. 1 shows a general configuration of an apparatus for laser beam illumination.

First, a laser annealing apparatus will be described. FIG. 1 is a conceptual diagram of a laser annealing apparatus used in this embodiment. The main part of the laser annealing apparatus is disposed on a table 1. KrF excimer laser light (wavelength: 248 nm; pulse width: 25 ns) is emitted from an oscillator 2. Apparently other excimer lasers and other types of lasers can also be used.

A laser beam emitted from the oscillator 2 is reflected by full-reflection mirrors 5 and 6, amplified by an amplifier 3, reflected by full-reflection mirrors 7 and 8, and introduced into an optics 4.

Figure 3:
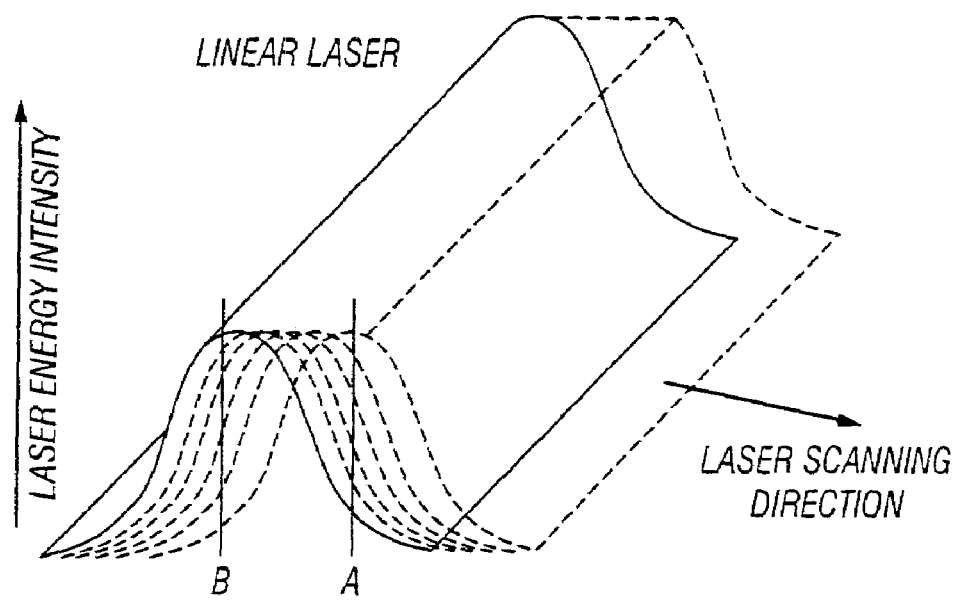
FIG. 3 schematically illustrates scanning with a linear laser beam having a normal-distribution type energy profile.

Immediately before entering the optics 4, the laser beam assumes a rectangular shape of about 3×2 cm². This laser beam is shaped into a long and narrow beam (linear beam) having a length of 10 to 30 cm and a width of 0.1 to 1 cm by the optics 4. This linear laser beam has a beam profile that is approximately of a normal-distribution type in the width direction as shown in FIG. 3. The laser beam as output from the optics 4 has a maximum energy of 1,000 mJ/shot.

The reason for shaping an original laser beam into a long and narrow beam is to improve the processing ability, as described below. A linear laser beam output from the optics 4 is applied to a sample 11 via a full-reflection mirror 9. Since the laser beam is longer than the width of the sample 11, the laser beam can be applied to the entire sample 11 by moving the sample 11 in one direction. Therefore, a stage/driving device 10 for the sample 11 can be made simple in configuration and can be maintained easily. Further, an alignment operation in setting the sample 11 can be facilitated.

The stage 10 to be illuminated with a laser beam is controlled by a computer, and so designed as to move perpendicularly to a linear laser beam. Further, if mechanism for rotating, within its plane, a table on which the sample 11 is to be mounted is provided, the laser beam scanning direction can be changed conveniently. Since a heater is provided under the stage 10, the sample 11 can be kept at a prescribed temperature during laser beam illumination.

Figure 2A:
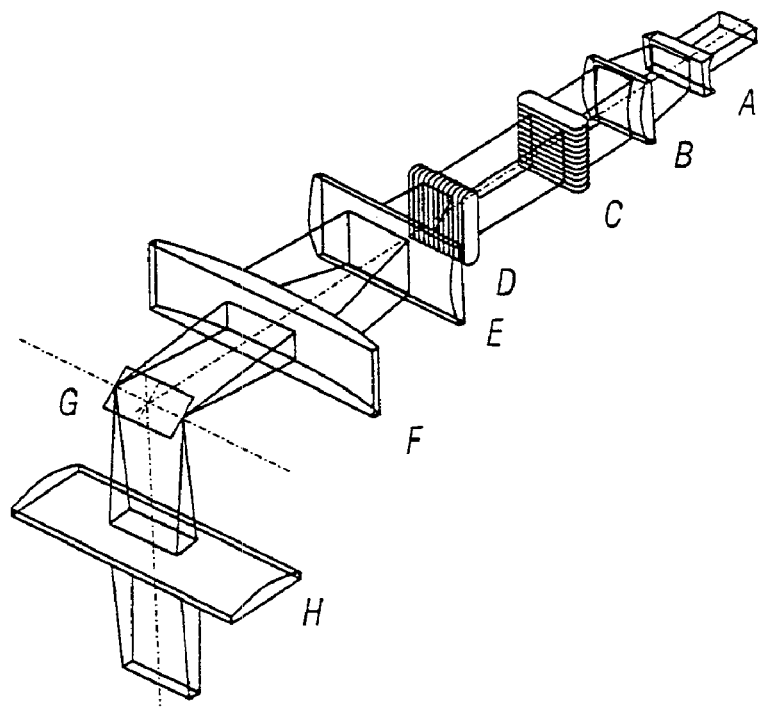
FIG. 2 shows an optics for shaping a laser beam into a linear form.
Figure 2B:
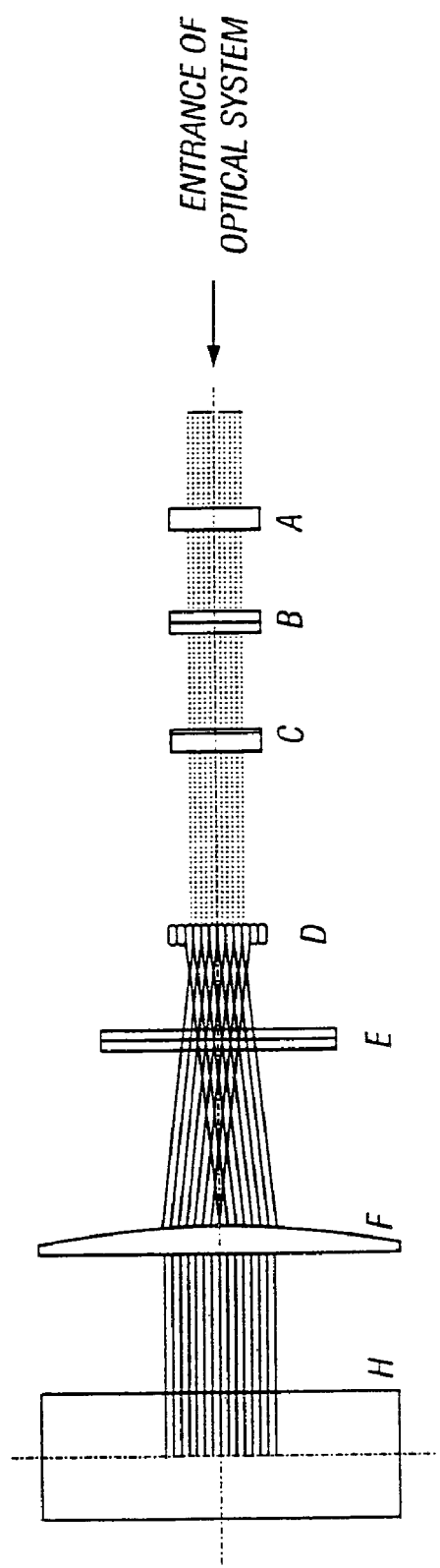
Figure 2C:
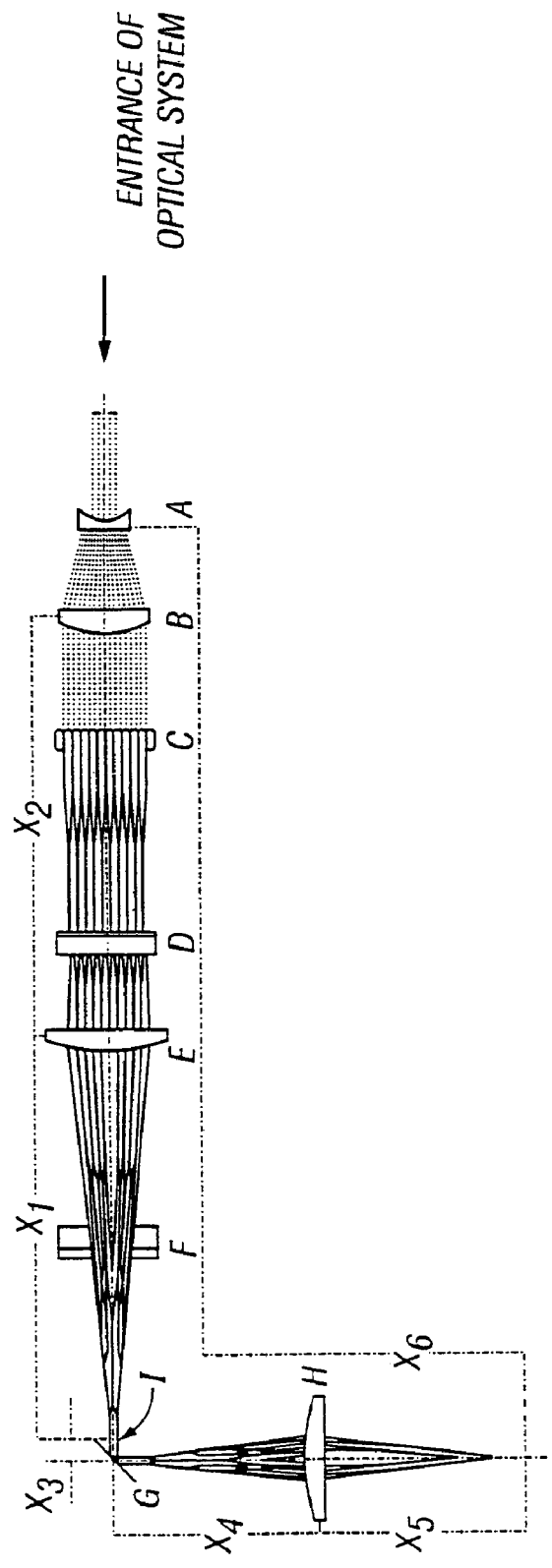

FIG. 2 shows an example of an optical path inside the optics 4. A laser beam input to the optics 4 is passed through a cylindrical concave lens A, a cylindrical convex lens B, and horizontal and vertical flyeye lenses C and D, further passed through cylindrical convex lenses E and F, reflected by a mirror G (which corresponds to the mirror 9 in FIG. 1), focused by a cylindrical lens H, and finally applied to the sample 11. By moving the lens H vertically with respect to the illumination surface, the laser beam profile on the illumination surface can be changed from a profile close to a rectangular one to a normal-distribution type profile. Since the full-reflection mirror G in FIG. 2 corresponds to the full-reflection mirror 9 in FIG. 1, actually the lens H is disposed between the full-reflection mirror 9 and the sample 11.

A description will be made of an example in which a crystalline silicon film is formed on a glass substrate by laser illumination according to the invention. First, a glass substrate (for example, Corning 7059 or 1737) of 10 cm×10 cm is prepared. A 2,000-Å-thick silicon oxide film is formed on the glass substrate by plasma CVD using TEOS as a material. This silicon oxide film serves as an undercoat film for preventing impurities from diffusing from the glass substrate into a semiconductor film.

Thereafter, a 500-Å-thick amorphous silicon film is deposited by plasma CVD or low-pressure thermal CVD. In the case of forming a crystalline silicon film through annealing by laser beam illumination, it is desired that an amorphous silicon film as a starting film have a thickness of not more than 1,000 Å. This is because if the amorphous silicon film is thicker than 1,000 Å, desired annealing effects cannot be obtained.

The amorphous silicon film is formed on the glass substrate in the above manner. Then, by using the apparatus shown in FIG. 1, a KrF excimer laser beam (wavelength: 248 nm; pulse width: 25 ns) is applied to the amorphous silicon film, so that it is converted into a crystalline silicon film.

The laser beam is shaped into a linear form by the beam shape converting lenses to provide a beam area of 125 mm×1 mm on the illumination object. Since the linear laser beam has a normal-distribution type profile, the beam edge is indefinite. In this specification, a beam is defined as a portion of a beam profile in which the energy is not less than 5% of the maximum energy.

The sample 11, which is mounted on the stage 10, is illuminated entirely by moving the stage 10 at 2 mm/s. As for the laser beam illumination conditions, the laser beam energy density is set at 300 mJ/cm² and the pulse rate (the number of pulse emissions per second) is set at 30 pulses/s. It is noted that the term "energy density" as used herein means an energy density value of a top portion of a beam profile that is close to a normal distribution.

Figure 4:
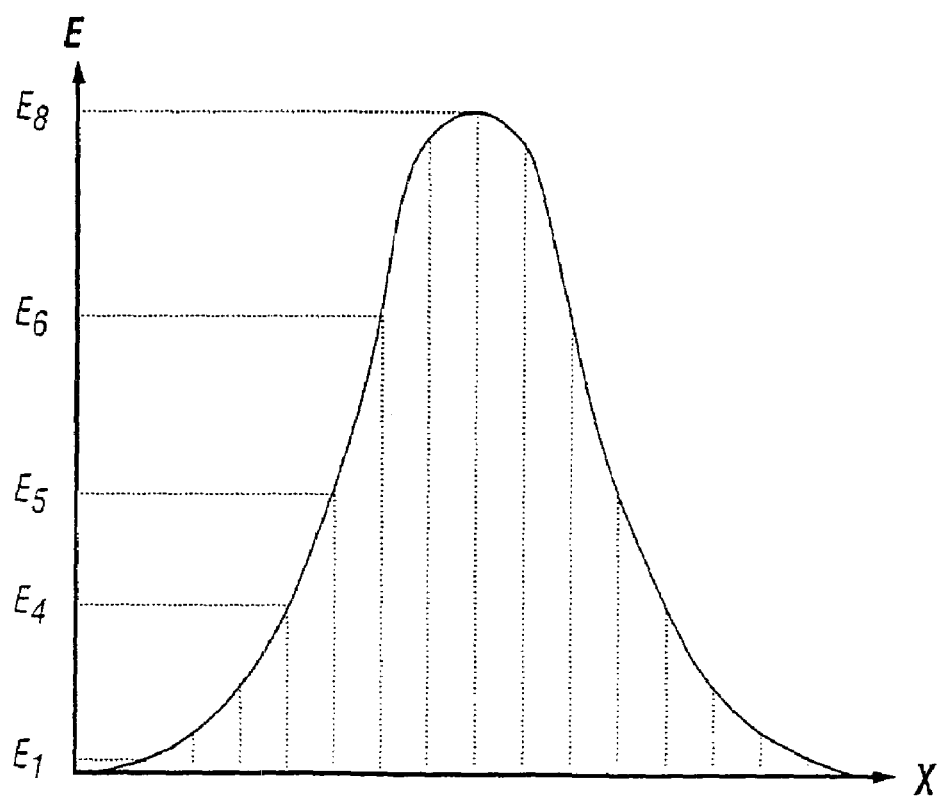
FIG. 4 is a graph showing a general form of a normal-distribution type energy profile.

With the above conditions, $V=2\times10^{-3}$ m/s, $N=30$ s$^{-1}$, and $L=1\times10^{-3}$ m. Therefore, $LN/V=15$, which satisfies the condition disclosed in this specification.

Where laser beam illumination is performed under the above conditions, an arbitrarily selected point (linear region) on the sample 11 is illuminated with 15 laser beams. The 15 laser beam pulses have energy density values corresponding to values $E_1$ to $E_{15}$ of a normal-distribution type profile shown in FIG. 4. If linear laser beams are used under the above conditions, laser beam pulses having energy density values of $E_1$ to $E_{15}$ are sequentially applied to cover a linear area of 125 mm×1 mm.

FIG. 3 shows how linear laser beams are applied while being moved for scanning. When attention is paid to, for instance, a linear region A, it is seen that first it is illuminated with a laser beam pulse having a low energy density corresponding to a foot portion of a normal distribution and then the energy density of applied laser beam pulses gradually increases. When attention is paid to a linear region B, it is seen that after it is illuminated with a laser beam pulse having a maximum energy density corresponding to a top portion of the normal distribution, the energy density of applied laser beam pulses gradually decreases. Therefore, the illumination energy can be optimized without changing the output of the laser oscillator 2. Since the laser oscillator 2 can always be rendered stable, uniform laser annealing is assured.

Experiments of the inventors have revealed that best crystalline silicon films can be obtained when the parameter LN/V is in a range of 10 to 30. That is, the best condition for crystallizing a silicon film is to illuminate its prescribed linear region 10 to 30 times. The energy density of illumination laser beams should be in a range of 100 to 500 mJ/cm², preferably 300 to 400 mJ/cm².

The substrate temperature is kept at 200° C. during laser beam illumination to reduce the speed of increase and decrease of the substrate surface temperature due to the laser beam illumination. It is known that in general an abrupt change in environmental conditions impairs the uniformity of a substance. Deterioration of the uniformity of the substrate surface due to the laser beam illumination is minimized by keeping the substrate temperature high. Although in this embodiment the substrate temperature is set at 200° C., in practice it is set at a temperature most suitable for laser annealing in a range of 100 to 600° C. No particular atmosphere control is performed; that is, the illumination is conducted in the air.

Embodiment 2

This embodiment is directed to a case of improving, by laser beam illumination, the crystallinity and uniformity of a silicon film that has already been crystallized by heating. Studies of the inventors have shown that a crystalline silicon film can be obtained by a heat treatment of about 550° C. and 4 hours by adding a metal element for accelerating crystallization of silicon. This technique is described in Japanese Unexamined Patent Publication Nos. Hei. 6-232059 and Hei. 244103.

By using this technique, a crystalline silicon film can be formed even on a large-area glass substrate in a temperature range where strain etc. cause no serious problem. Thin film transistors produced by using such a crystalline silicon film have characteristics far superior to those of conventional thin-film transistors produced by using an amorphous silicon film. Specifically, while the mobility of thin-film transistors using an amorphous silicon film is less than 1 cm$^2$/Vs, that of thin-film transistors produced by utilizing the above crystallizing technique involving the use of a metal element is more than several tens of cm$^2$/Vs.

However, observations by taking electron microscope photographs and by Raman spectroscopy have revealed that many amorphous components remain in a crystalline silicon film produced by using the above technique. It has also been proved that by crystallizing the remaining amorphous components by laser beam illumination, the characteristics of resulting thin-film transistors can further be improved.

A description will be made of a process for manufacturing a crystalline silicon film according to this embodiment. First, a 2,000-Å-thick silicon oxide film as an undercoat film is deposited on a glass substrate. A 500-Å-thick amorphous silicon film is deposited thereon by plasma CVD. A nickel acetate salt solution is then applied to the surface of the amorphous silicon film with spin coater. The nickel concentration in the nickel acetate salt solution is so adjusted that nickel will finally remain in a silicon film at a concentration of $1 \times 10^{16}$ to $5 \times 10^{19}$ cm$^{-3}$. This is because if the nickel concentration exceeds the above range, properties as a metal silicide appear, and if it is lower than the above range, the effect of accelerating crystallization is not obtained. The nickel concentration is defined as a maximum value of a SIMS (secondary ion mass spectrometry) measurement.

In terms of reproducibility and effects, nickel is most advantageous as the metal element for accelerating crystallization of lo silicon. However, there may also be used one or a plurality of elements selected from Fe, Co, Ru, Rh, Pd, Os, Ir, Pt, Cu and Au. In particular, Fe, Cu and Pd, and even Pt can provide sufficient effects for practical use.

In the state that nickel is retained adjacent to the surface of the amorphous silicon film, the substrate is left at 450° C. for 1 hour in a nitrogen atmosphere, to remove hydrogen from the amorphous silicon film. This heat treatment is conducted to reduce the threshold energy of a later performed crystallization step by intentionally forming dangling bonds.

Thereafter, a heat treatment of 550° C. and 4 hours is performed in the state that nickel is retained adjacent to the surface of the amorphous silicon film, to convert the amorphous silicon film into a crystalline silicon film. Although this heat treatment may be performed at a temperature higher than 500° C., it is important that the temperature be lower than the strain point of the glass substrate.

Thus, a crystalline silicon film is formed on the glass substrate. Laser beams are then applied to the silicon film by the same method and under the same conditions as in the first embodiment. As a result, a crystalline silicon film further enhanced in crystallinity and uniformity is obtained. It has been revealed by experiments that the laser beam illumination is more effective than in the first embodiment if the energy density of laser beams is increased by 20 to 50%.

As is the case of this embodiment, the technique of improving, by laser beam illumination, the crystallinity of a silicon film crystallized by a heat treatment with addition of a metal element for accelerating crystallization of silicon can provide a crystalline silicon film that is superior in crystal quality and uniformity, and productivity to that produced only by heating or laser beam illumination.

Where laser light is applied, by an ordinary method, to a crystalline silicon film that has been produced by heating with introduction of a metal element such as nickel, there occur such phenomena as segregation and partial cohesion of the metal element. Segregation and partial cohesion of the metal element, which cause trap centers, are factors of greatly deteriorating the electrical characteristics of resulting semiconductor devices. In contrast, no such phenomena are found if the laser beam illumination method of this invention is employed. This is because the segregation and partial cohesion of the metal element can be suppressed by gradually increasing the laser beam energy starting from a low level.

Embodiment 3

While in the first and second embodiments linear laser beams having a normal-distribution type energy profile are applied, in this embodiment linear laser beams having a trapezoidal energy profile are applied. Also in this embodiment, a crystalline silicon film is annealed by illuminating it with KrF excimer laser beams (wavelength: 248 nm; pulse width: 25 ns) by using the laser illumination apparatus shown in FIGS. 1 and 2.

Figure 5:
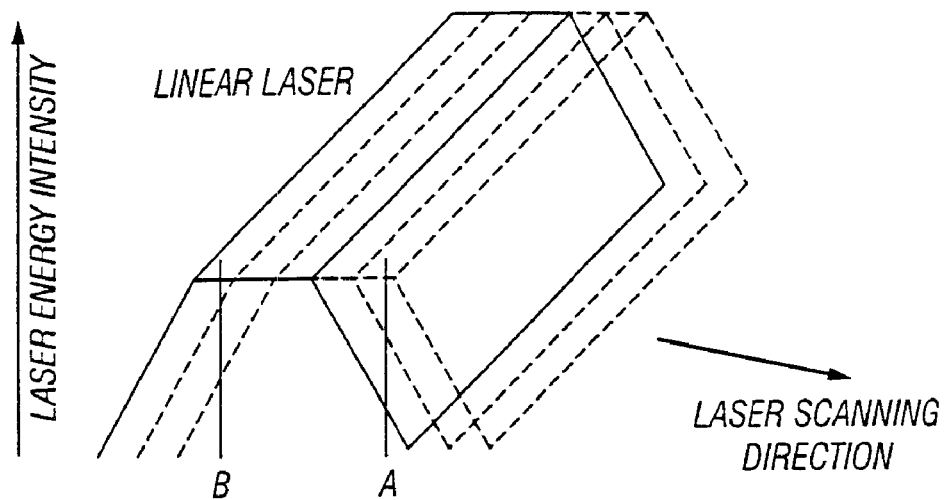
FIG. 5 schematically illustrates scanning with a linear laser beam having a trapezoidal energy profile.

A laser beam is shaped into a linear form by the optics 4, to have a beam area of 125 mm×1 mm on an illumination object. The energy profile in the width direction of the linear form is trapezoidal as shown in FIG. 5. Due to the nature of such a beam profile of the linear laser beam, the beam edge is indefinite. In this specification, a beam is defined as a portion of a beam profile in which the energy is not less than 5% of the maximum energy.

The sample 11, which is mounted on the stage 10, is illuminated entirely with linear laser beams by moving the stage 10 at 2 mm/s. As for the laser beam illumination conditions, the laser beam energy density is set at 100 to 500 mJ/cm$^2$ and the pulse rate is set at 30 pulses/s. It is noted that the term "energy density" as used herein means an energy density value of a top base portion (having a maximum value) of a trapezoidal beam profile.

If laser beam illumination is performed under the above conditions, in which the width of pulse laser beams is 1 mm and it takes 0.5 second for the sample 11 to pass the 1-mm-wide area, a point on the illumination surface receives 15 laser beam pulses. That is, an arbitrarily selected point on the sample 11 is illuminated with 15 laser beams in one scan. In this embodiment, since linear laser beams having a trapezoidal energy profile are applied, the illumination energy density increases in first several beam applications in one scan and decreases in last several beam applications.

This is schematically illustrated in FIG. 5. The laser beam energy gradually increases in the first half of the 15 beam applications (pay attention to portion A in FIG. 5), and gradually decreases in the last half (portion B in FIG. 5). Therefore, the illumination energy can be optimized without changing the output of the laser oscillator 2. Since the laser oscillator 2 can always be rendered stable, uniform laser annealing is assured. The number 15 can easily be calculated from the laser beam width, the speed of the stage 10, and the number of laser beam pulses. According to our experiments, a silicon film having best crystallinity can be produced by 3 to 100 beam applications, preferably 10 to 20 beam applications.

The substrate temperature is kept at 500° C. during laser beam illumination to reduce the speed of increase and decrease of the substrate surface temperature due to the laser beam illumination. It is known that in general an abrupt change in environmental conditions impairs the uniformity of a substance. Deterioration of the uniformity of the substrate surface due to the laser beam illumination is minimized by keeping the substrate temperature high. Although in this embodiment the substrate temperature is set at 500° C., in practice it is set at a temperature most suitable for laser annealing in a range of 400° C. to the strain point of the glass substrate. No particular atmosphere control is performed; that is, the illumination is conducted in the air.

Fourth Embodiment

Figure 6:
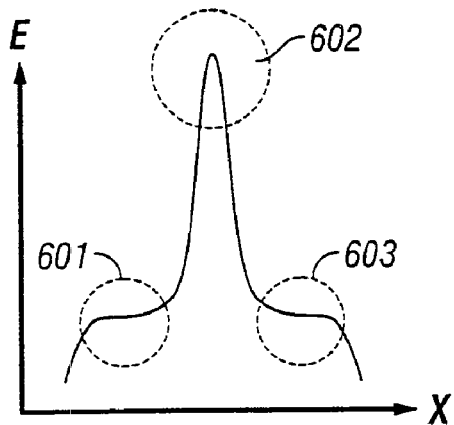
FIG. 6 is an irradiation energy profile in accordance with the present invention.

A fourth embodiment is characterized in that an energy profile of an irradiated laser beam has a shape shown in FIG. 6 by devising an optical system.

In annealing due to the irradiation of a laser beam onto a silicon film, it is preferable that an irradiated energy density is gradually increased in a region-to be irradiated, and further the irradiated energy density is gradually lowered.

This is because the effect of annealing is unified, and further the roughness of the surface of a silicon film, which is caused by annealing, can be restrained.

The irradiated energy profile shown in FIG. 6 is a profile in a case where an amorphous silicon film is crystallized by the irradiation of a laser beam.

The irradiated energy profile shown in FIG. 6 represents a section of a laser beam which is shaped linearly. In FIG. 6, a laser beam is irradiated on an object to be irradiated while scanning the object from right to left.

It should be noted that, in FIG. 6, the axis of ordinate represents a relative value of a normalized irradiated energy density. The axis of abscissa represents the widthwise direction of a laser beam which is shaped linearly.

Hereinafter, a laser annealing process will be described with reference to a process of irradiating a laser beam on an amorphous silicon film to change the amorphous silicon film into a crystalline silicon film as an example.

In the case where attention is paid to a certain specified region to be irradiated, a portion 603 of a laser beam is irradiated onto the region to be irradiated. In this situation, the energy density of a portion 603 of a laser beam is set to such a degree that the amorphous silicon film is not heated. With such a density, preheating is conducted before the amorphous silicon film is crystallized.

Subsequently, as a laser beam scans the object to be irradiated, the portion 602 of a laser beam is irradiated onto the region to be irradiated.

The portion 602 of a laser beam is set so as to have an energy density that allows the amorphous silicon film to be melted and crystallized.

With such a setting, the amorphous silicon film can be crystallized. In this situation, since heating conducted by the irradiation of the portion 602 of a laser beam is not rapid, the crystallization can be conducted with an excellent uniformity and the restrained generation of defects.

Thereafter, the portion 601 of a laser beam is irradiated onto the region to be irradiated by scanning the object by a laser beam.

The portion 601 of a laser beam has the same energy density as that of the portion 603 of a laser beam. In other words, the portion 601 of a laser beam has an irradiated energy density to such a degree that the silicon film is heated without being crystallized.

With the irradiation of the portion 601 of a laser beam the silicon film which has been crystallized can come to a state where it is not rapidly cooled.

With the irradiation of the portion 601 of a laser beam, a time of period required for solidifying the silicon film which has been melted once can be lengthened.

The portion 601 of a laser beam functions to set the energy density in accordance with the shape of a beam or the conditions of annealing.

With such a function, crystal growth can be unified. Also, the occurrence of defects or a stress can be restrained. Further, the generation of roughness (concave/convex) of the surface can be restrained.

In the above-mentioned processes, heating at a prestage of the crystallization of the amorphous silicon film in accordance with rapid heating due to the irradiation of a laser beam, heating due to the irradiation of a laser beam for crystallizing the amorphous silicon film, and heating that allows rapid cooling of the crystallized silicon film to be restrained (or heating for lengthening a melting period) can be realized by one process of irradiating a laser beam.

In the beam profile shown in FIG. 6, the energy densities of irradiated energies of the portions 601 and 603 of a laser beam are identical to each other (or the same degree). However, with the alternation of design of an optical system, the beam sectional shape can be altered opportunely.

Figure 7:
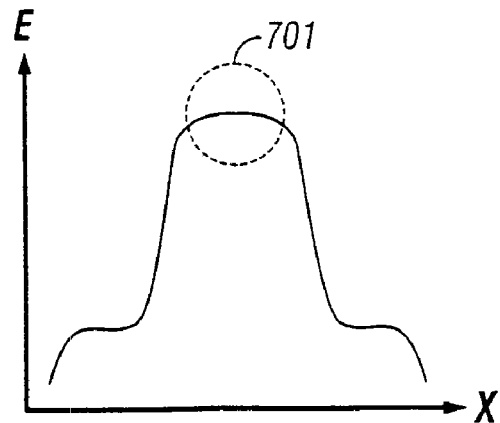
FIG. 7 is an irradiation energy profile in accordance with the present invention.

Furthermore, as shown in FIG. 7, a portion 701 of a laser beam having an irradiated energy density for crystallization may be increased in width so that a high irradiated energy is irradiated on a predetermined region to be irradiated for a longer period.

Such an alternation of design can be conducted opportunely in accordance with a material to be irradiated, its film thickness, the scanning rate of a laser beam, and annealing effect as required.

In this example, a case where the amorphous silicon film is crystallized was described as one example. However, as other examples, this structure can be used for annealing of the silicon film which has been made amorphous by implantation of impurity ions, the acceleration of the crystallization of the silicon film which has been crystallized by heating.

The laser illumination technique of the invention can improve the productivity and the uniformity of a film to be used for semiconductor devices. While the invention can be applied to any laser processing step used for a semiconductor device manufacturing process, it is particularly advantageous in providing superior characteristics and good uniformity when applied to a thin-film transistor manufacturing process. When illuminating a desired region plural times with laser beams of different illumination energy densities, the invention can prevent misregistration between laser beam application areas. This is very effective in obtaining uniform device characteristics.

The methods of the invention can greatly improve the operation efficiency of a step in which the energy density of laser beams applied to a desired region is gradually changed in plural beam applications. That is, the invention can provide, by the illumination in one laser beam scan, the effects similar to those as obtained by the conventional laser beam illumination method in which laser beams are applied in plural scans while their energy density is changed in a step-like manner. Therefore, the multi-step illumination can be performed with optimum illumination energy without changing the output of the laser oscillator. Since the laser oscillator can always be rendered stable, uniform laser annealing is assured.

What is claimed is:

1. A method of manufacturing a semiconductor device comprising:
   forming a semiconductor film over a substrate;
   emitting a pulse laser light at a rate of N pulses per second;
   shaping the pulse laser light into a beam having a cross section perpendicular to a propagation direction of the beam, said cross section having a width and a length, wherein the length is longer than the width, wherein the beam has a width L (m) perpendicular to the length direction, and the beam having substantially a constant energy distribution along a lengthwise direction;
   applying the beam to a portion of the semiconductor film; and
   scanning the semiconductor film with the beam perpendicular to the lengthwise direction of the cross section at a speed V (m/s),
   wherein the scanning step is conducted in air,
   wherein the number of beams applied to said portion in one scan satisfies a relationship $3 \leq LN/V \leq 100$, and
   wherein the width L (m) is defined as a beam in a region having 5% or more of an energy density with respect to a maximum energy density of the beam on the irradiation surface.

2. The method according to claim 1, wherein the beam has a normal-distribution type energy profile perpendicular to the length direction.

3. The method according to claim 1, wherein the beam has a trapezoidal energy profile perpendicular to the length direction.

4. The method according to claim 1, wherein the number of beams applied to said portion in one scan satisfies a relationship $10 \leq LN/V \leq 30$.

5. The method according to claim 1, wherein the semiconductor film has a thickness of 150 to 1000 Å.

6. A method of manufacturing a semiconductor device comprising:
   forming an insulating film including TEOS over a substrate;
   forming a semiconductor film over the insulating film;
   emitting a pulse laser light at a rate of N pulses per second;
   shaping the pulse laser light into a beam having a cross section perpendicular to a propagation direction of the beam, said cross section having a width and a length, wherein the length is longer than the width, wherein the beam has a width L (m) perpendicular to the length direction, and the beam having substantially a constant energy distribution along a lengthwise direction;
   applying the beam to a portion of the semiconductor film; and
   crystallizing the semiconductor film by scanning the semiconductor film with the beam perpendicular to the lengthwise direction of the cross section at a speed V (m/s),
   wherein the number of beams applied to said portion in one scan satisfies a relationship $3 \leq LN/V \leq 100$, and
   wherein the width L (m) is defined as a beam in a region having 5% or more of an energy density with respect to a maximum energy density of the beam on the irradiation surface.

7. The method according to claim 6, wherein the beam has a normal-distribution type energy profile perpendicular to the length direction.

8. The method according to claim 6, wherein the beam has a trapezoidal energy profile perpendicular to the length direction.

9. The method according to claim 6, wherein the number of beams applied to said portion in one scan satisfies a relationship $10 \leq LN/V \leq 30$.

10. The method according to claim 6, wherein the semiconductor film has a thickness of 150 to 1000 Å.

11. The method according to claim 6, wherein the insulating film has a thickness of 2000 Å.

12. A method of manufacturing a semiconductor device comprising:
    forming an insulating film including TEOS over a substrate;
    forming a semiconductor film over the insulating film;
    removing hydrogen from the semiconductor film by heating the semiconductor film;
    emitting a pulse laser light at a rate of N pulses per second;
    shaping the pulse laser light into a beam having a cross section perpendicular to a propagation direction of the beam, said cross section having a width and a length, wherein the length is longer than the width, wherein the beam has a width L (m) perpendicular to the length direction, and the beam having substantially a constant energy distribution along a lengthwise direction;
    applying the beam to a portion of the semiconductor film; and
    scanning the semiconductor film with the beam perpendicular to the lengthwise direction of the cross section at a speed V (m/s),
    wherein the number of beams applied to said portion in one scan satisfies a relationship $3 \leq LN/V \leq 100$, and
    wherein the width L (m) is defined as a beam in a region having 5% or more of an energy density with respect to a maximum energy density of the beam on the irradiation surface.

13. The method according to claim 12, wherein the beam has a normal-distribution type energy profile perpendicular to the length direction.

14. The method according to claim 12, wherein the beam has a trapezoidal energy profile perpendicular to the length direction.

15. The method according to claim 12, wherein the number of beams applied to said portion in one scan satisfies a relationship $10 \leq LN/V \leq 30$.

16. The method according to claim 12, wherein the semiconductor film has a thickness of 150 to 1000 Å.

17. The method according to claim 12, wherein the insulating film has a thickness of 2000 Å.

18. A method of manufacturing a semiconductor device comprising:
    forming a semiconductor film over a substrate;
    adding a metal element for accelerating crystallization of silicon to the semiconductor film;
    crystallizing the semiconductor film by heating the semiconductor film;
    emitting a pulse laser light at a rate of N pulses per second;
    shaping the pulse laser light into a beam having a cross section perpendicular to a propagation direction of the beam, said cross section having a width and a length, wherein the length is longer than the width, wherein the beam has a width L (m) perpendicular to the length direction, and the beam having substantially a constant energy distribution along a lengthwise direction;
    applying the beam to a portion of the semiconductor film; and
    scanning the semiconductor film with the beam perpendicular to the lengthwise direction of the cross section at a speed V (m/s), wherein the number of beams applied to said portion in one scan satisfies a relationship $3 \leq LN/V \leq 100$, and wherein the width L (m) is defined as a beam in a region having 5% or more of an energy density with respect to a maximum energy density of the beam on the irradiation surface.

19. The method according to claim 18, wherein the beam has a normal-distribution type energy profile perpendicular to the length direction.

20. The method according to claim 18, wherein the beam has a trapezoidal energy profile perpendicular to the length direction.

21. The method according to claim 18, wherein the number of beams applied to said portion in one scan satisfies a relationship $10 \leq LN/V \leq 30$.

22. The method according to claim 18, wherein the semiconductor film has a thickness of 150 to 1000 Å.

23. The method according to claim 18, wherein the metal element is one selected from the group consisting of nickel, Fe, Co, Ru, Rh, Pd, Os, Ir, Pt, Cu and Au.

* * * * *